United States Patent
Moon

(10) Patent No.: US 7,952,382 B2
(45) Date of Patent: May 31, 2011

(54) IMPEDANCE CALIBRATION CIRCUIT, SEMICONDUCTOR MEMORY DEVICE WITH THE IMPEDANCE CALIBRATION CIRCUIT AND LAYOUT METHOD OF INTERNAL RESISTANCE IN THE IMPEDANCE CALIBRATION CIRCUIT

(75) Inventor: In Jun Moon, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/244,008

(22) Filed: Oct. 2, 2008

(65) Prior Publication Data

US 2009/0289658 A1 Nov. 26, 2009

(30) Foreign Application Priority Data

May 22, 2008 (KR) ........................ 10-2008-0047391

(51) Int. Cl.
*H03K 17/16* (2006.01)
*H03K 19/003* (2006.01)

(52) U.S. Cl. ........................................................ 326/30

(58) Field of Classification Search .................. 326/30
See application file for complete search history.

(56) References Cited

U.S. PATENT DOCUMENTS

| | | | | |
|---|---|---|---|---|
| 6,064,224 A * | 5/2000 | Esch et al. | ........................ | 326/30 |
| 6,535,047 B2 * | 3/2003 | Mughal et al. | ................. | 327/378 |
| 6,717,455 B2 * | 4/2004 | Mughal et al. | ................. | 327/378 |
| 7,230,448 B2 * | 6/2007 | Choe | ................................ | 326/30 |
| 7,573,288 B2 * | 8/2009 | Ayyapureddi et al. | ........... | 326/30 |
| 7,573,289 B2 * | 8/2009 | Kim et al. | ......................... | 326/30 |
| 2002/0063576 A1 * | 5/2002 | Kim et al. | ......................... | 326/30 |
| 2003/0218477 A1 * | 11/2003 | Jang et al. | ........................ | 326/30 |
| 2004/0217774 A1 * | 11/2004 | Choe | ................................ | 326/30 |
| 2005/0104620 A1 * | 5/2005 | Ueno | ................................ | 326/30 |
| 2005/0110516 A1 * | 5/2005 | Ueno | ................................ | 326/30 |

FOREIGN PATENT DOCUMENTS

| | | |
|---|---|---|
| KR | 1020050104236 A | 11/2005 |
| KR | 10-0583636 B1 | 5/2006 |
| KR | 1020060062817 A | 6/2006 |

* cited by examiner

*Primary Examiner* — James H. Cho
*Assistant Examiner* — Matthew C Tabler
(74) *Attorney, Agent, or Firm* — Ladas & Parry LLP

(57) ABSTRACT

An impedance calibration circuit for impedance matching between a semiconductor memory device and an external device includes a driving circuit and a comparing circuit. The driving circuit has a plurality of internal resistances, with one or more of the internal resistances being a variable resistance. The driving circuit compares the impedance of the internal resistances to the input/output impedance of the external device in order to provide a calibration voltage. The comparing circuit compares the calibration voltage to a reference voltage and provides a code signal for calibrating the impedance corresponding to output data with the input/output impedance of the external device. The impedance calibration circuit calibrates an impedance mismatch between the impedance calibration circuit and a data input/output driver by adjusting the impedance of the impedance calibration circuit through the variable resistance.

10 Claims, 6 Drawing Sheets

(a)

(b)

IMPEDANCE CALIBRATION CIRCUIT, SEMICONDUCTOR MEMORY DEVICE WITH THE IMPEDANCE CALIBRATION CIRCUIT AND LAYOUT METHOD OF INTERNAL RESISTANCE IN THE IMPEDANCE CALIBRATION CIRCUIT

CROSS-REFERENCE TO RELATED APPLICATIONS

The present application claims priority to Korean patent application number 10-2008-0047391 filed on May 22, 2008, which is incorporated herein by reference in its entirety.

BACKGROUND OF THE INVENTION

The present invention relates generally to a semiconductor memory device, and more particularly, to an impedance calibration circuit for impedance matching between a semiconductor memory device and an external device, a semiconductor memory device including the impedance calibration circuit at an input/output terminal thereof, and a layout method of an internal resistance in the impedance calibration circuit.

Typically, a high speed semiconductor memory device such as a DDR3 is provided with an impedance calibration circuit that calibrates an on die termination (ODT) value in response to process, voltage, and temperature (PVT) variation.

The impedance calibration circuit calibrates the impedance of an internal resistance by utilizing a resistance connected to the outside of the memory chip and provides a code signal having the calibrated information to a data input/output (I/O) driver. Then, the driving level of the data I/O driver is adjusted using the code signal and impedance matching with an external device that interfaces data is thereby completed.

The impedance calibration circuit includes a driver provided with a plurality of legs in order to calibrate the impedance of the internal resistance, and the code signal having the impedance calibration information is generated and outputted by comparing the impedance of the legs to the impedance of the external resistance.

The data I/O driver also includes a plurality of legs for adjusting the driving force in response to the code signal. The impedance corresponding to the data outputted to outside the memory device is calibrated as the impedance of the legs varies in response to the code signal.

However, the structure of conventional semiconductor memory devices tends to cause an impedance mismatch between the impedance calibration circuit and the data I/O driver. It is difficult to detect and calibrate for this impedance mismatch, and therefore the generated impedance mismatch can be problematic.

Specifically, in a conventional data I/O driver, the legs have various resistance values in order to support various internal resistance modes. To the contrary, a conventional impedance calibration circuit only includes legs for comparison with an external resistance. That is, unlike the data I/O driver, the legs of the conventional impedance calibration circuit have only a single resistance value, with the single resistance value being the same resistance value as the external resistance.

Therefore, in a conventional semiconductor memory device there is a high probability that an impedance mismatch will occur, since the legs of the impedance calibration circuit and the legs of the data I/O driver have different layout structures.

Additionally, both the conventional impedance calibration circuit and the conventional data I/O driver include a pull-up driver and a pull-down driver. The pull-up driver of the impedance calibration circuit is connected to a pin of the external resistance. The pull-down driver of the impedance calibration circuit is not directly connected to the pin of the external resistance, and is instead connected to the pull-up driver through an internal node. To the contrary, in a conventional data I/O driver, the pull-up driver and pull-down driver are both connected to an external data input/output pin.

The difference in the pull-up and pull-down drivers of the conventional data I/O driver and the conventional impedance calibration circuit are another example of a differing structure that causes a problem. The difference in structure of the connection to an external pin of the driver of the impedance calibration circuit and the data I/O driver results in a high probability that an impedance mismatch will be generated.

To summarize, an impedance mismatch is generated between the impedance calibration circuit and the data I/O driver of the conventional device due to the difference in layout structure and connection between the impedance calibration circuit and the data I/O driver.

This impedance mismatch is problematic, in that an impedance calibration value DQ_CAL may differ significantly from a target value TARGET upon pull-down driving of the data I/O driver. This difference is shown in illustration (a) of FIG. 1.

For reference, in illustration (a) and (b) of FIG. 1, 'ZQ' indicates the impedance of the impedance calibration circuit before the impedance calibration, 'ZQ_CAL' indicates the impedance of the impedance calibration circuit after the impedance calibration, and 'DQ' indicates impedance of the data I/O driver before the impedance calibration.

In requires much time and effort to fix the calibration problem caused by the conventional impedance calibration circuit which includes legs having only a single resistance value and which calibrates the impedance by comparing these legs only to an external resistance.

SUMMARY OF THE INVENTION

Embodiments of the present invention include an impedance calibration circuit that can easily adjust impedance so that the impedance matches the impedance of a data I/O driver.

Additionally, embodiments of the present invention include a semiconductor memory device that can easily calibrate an impedance mismatch occurring between a data I/O driver and an impedance calibration circuit.

Further, embodiments of the present invention include a method of laying out an internal resistance of an impedance calibration circuit that can easily calibrate the impedance of a resistance provided within the impedance calibration circuit.

In one aspect of the present invention, an impedance calibration circuit includes a driving circuit including internal resistances, at least one thereof being a variable resistance. The driving circuit compares the impedance of the internal resistances to the input/output impedance of an external device and provides the result as a calibrated voltage. A comparing circuit compares the calibrated voltage to a reference voltage and provides a code signal for the impedance calibration with the external device.

The variable resistance may include a metal line having a passage extending between both ends thereof, and a metal option having a connection structure that shortens the passage.

Alternatively, the variable resistance may include resistance elements having a parallel structure and switching elements that control the parallel connection between the resistance elements. The resistance value of the variable resistance is varied by selectively connecting the respective switching elements.

Preferably, each switching element corresponds to a metal option selectively connected between the resistance elements.

Preferably, the plurality of the internal resistances are connected in parallel to an external resistance corresponding to the input/output impedance of an external device, and the plurality of the internal resistances (except for the variable resistance) have resistance values that have a predetermined proportional relationship with one another.

Preferably, the plurality of the internal resistances (except for the variable resistance has resistance values that are in a proportional relationship of 1:1 with one another.

According to another aspect of the present invention, a semiconductor memory device includes an impedance calibration circuit including internal resistances, at least one thereof being a variable resistance, and comparing the impedance of the internal resistances to the input/output impedance of an external device and providing a code signal; and a data input/output driver driving data and calibrating, in response to the code signal, an impedance corresponding to the data so that the impedance corresponds to the input/output impedance of the external device.

Preferably, the impedance calibration circuit adjusts a code value of the code signal through the comparison of the impedance of the internal resistances and the input/output impedance of the external device, and the impedance of the internal resistances is adjusted by the code value of the code signal.

Preferably, the variable resistance has a resistance value that is varied independently of the impedance determined following the code value of the code signal.

Preferably, the impedance calibration circuit includes a driving circuit including the internal resistances, at least one thereof being the variable resistance, and comparing the impedance of the internal resistances and the input/output impedance of the external device and providing the result as a calibration voltage; and a comparing circuit comparing the calibration voltage to a reference voltage and providing the code signal.

Preferably, the driving circuit includes driving devices each providing a predetermined voltage in response to the code signal; constant resistances are respectively connected in correspondence to some of the driving devices between a node to which the predetermined voltage is provided and a node to which the calibration voltage is provided; and at least one variable resistance is connected in correspondence to the remaining driving devices other than the driving devices to which the constant resistances are connected between a node to which the predetermined voltage is provided and a node to which the calibration voltage is provided.

The variable resistance may include a metal line having a passage extending between both ends thereof, and a metal option having a connection structure that shortens the passage.

Alternatively, the variable resistance includes resistance elements having a parallel structure and switching elements that control the parallel connection between the resistance elements, and the resistance value of the variable resistance is varied by selective connections of respective switching elements.

Preferably, each switching element corresponds to the metal option selectively connected between the resistance elements.

Preferably, the constant resistances have resistance values that are in a predetermined proportional relationship with one another.

Preferably, the constant resistances have resistance values that are in a proportional relationship of 1:1 with one another.

Preferably, the data input/output driver includes resistances that vary the impedance corresponding to the data in response to the code signal, and the resistances include constant resistances and at least one variable resistance.

According to another aspect of the present invention, a method of laying out internal resistance in an impedance calibration circuit, in which a plurality of internal resistances for impedance matching between a semiconductor memory device and an external device is laid out in an impedance calibration circuit provided in the semiconductor memory device, includes laying out at least one of the plurality of internal such that it includes a metal line having a passage extended between both ends thereof; and at least one metal option having a connection structure that shortens the extended passage of the metal line, wherein the resistance value is varied following whether the metal option is cut or not.

The metal line may have at least one bended portion and form a closed passage by the bended portion and the metal option.

Alternatively, the metal line is formed via two or more layers so as to have at least one bended portion.

Preferably, the metal line includes a plurality of resistance elements respectively formed through the two or more layers and electrically connected with each other, and the metal option is connected between the resistance elements.

The present invention provides an impedance calibration circuit including internal resistances having at least one variable resistance. Therefore, it is possible to easily calibrate impedance mismatch between the impedance calibration circuit and a data I/O driver.

Also, the present invention provides a semiconductor memory device in which at least one of the internal resistances of an impedance calibration circuit is a variable resistance. Therefore, it is possible to easily calibrate impedance mismatch between the impedance calibration circuit and a data I/O driver.

Also, the present invention provides a method of laying out internal resistance in an impedance calibration circuit in which a resistance value of at least one of the internal resistances provided in an impedance calibration circuit is variable. Therefore, it is possible to easily calibrate impedance mismatch between the impedance calibration circuit and a data I/O driver.

DESCRIPTION OF SPECIFIC EMBODIMENTS

Hereinafter, preferred embodiments of the present invention will be described in detail with reference to the accompanying drawings.

The present invention discloses an impedance calibration circuit that can vary the resistance value of at least one of a plurality of internal resistances for impedance matching with the I/O impedance of an external device, and a semiconductor memory device having the same.

Figure 1:
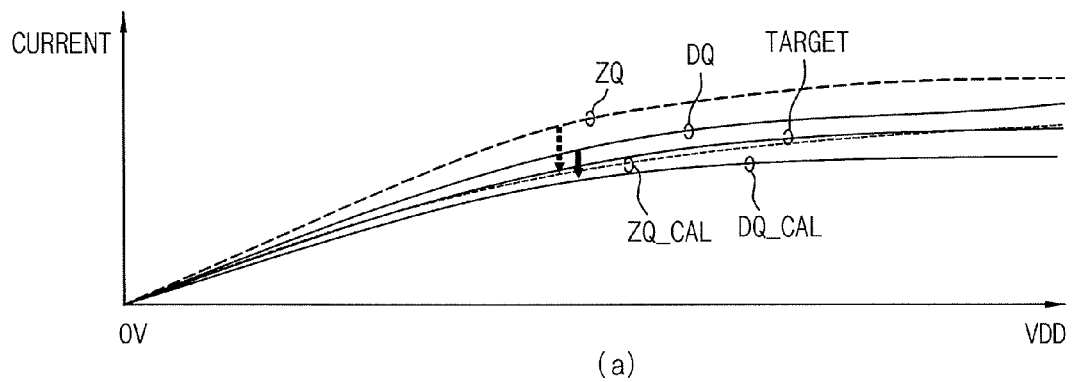
FIG. 1 is a graph illustrating a problem caused by an impedance mismatch between an impedance calibration circuit and a data I/O driver in a conventional device.
Figure 1:
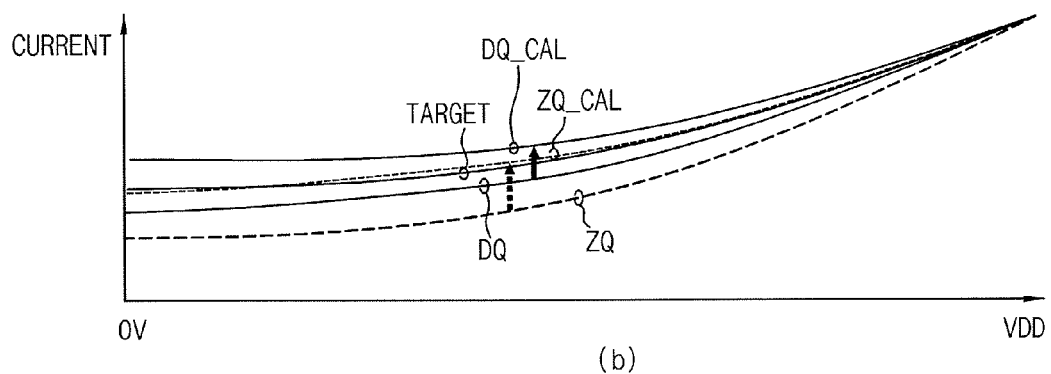
Figure 2:
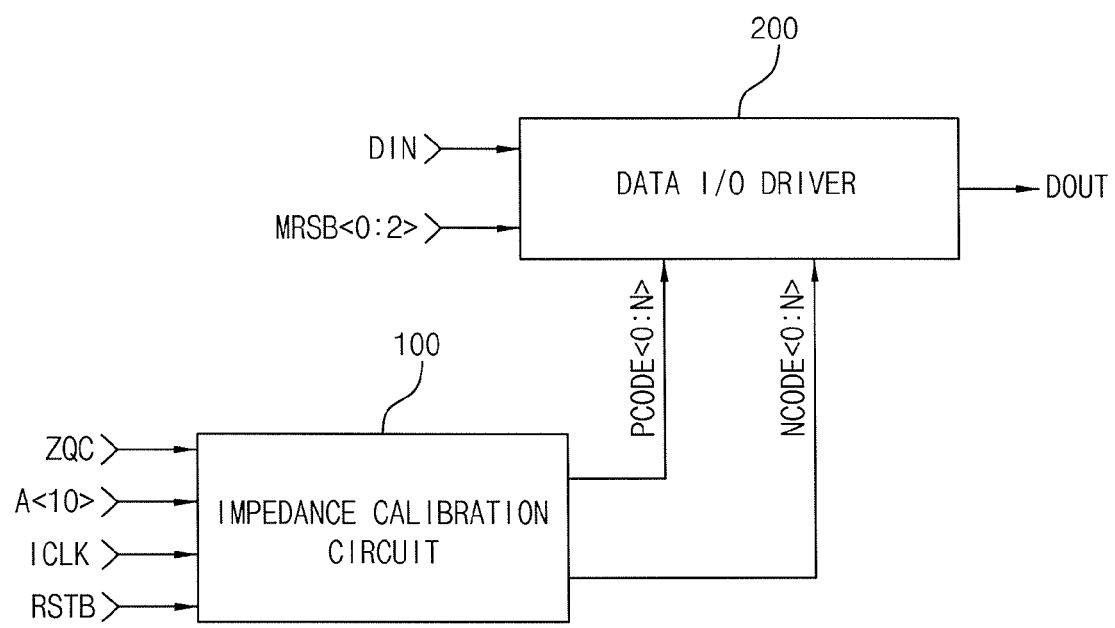
FIG. 2 is a block diagram showing a semiconductor memory device according to an embodiment of the present invention.

Referring to FIG. 2, a semiconductor memory device according to an embodiment of the present invention includes an impedance calibration circuit 100 and a data I/O driver 200.

The impedance calibration circuit 100 receives a command signal ZQC, an address signal A<10>, an internal clock ICLK, and a reset signal RSTB used to determine an impedance calibration time. The impedance calibration circuit 100 compares the impedance of resistances (not shown) provided therein to the impedance of an external resistance (not shown) corresponding to an I/O impedance of an external device during a determined calibration time and outputs a pull-up code signal PCODE<0:N> (hereinafter, 'N' is a natural number of more than 1) and a pull-down code signal NCODE<0:N>.

The data I/O driver 200 drives input data DIN in order to output the input data DIN as output data DOUT. The data I/O driver 200 selects some of a plurality of resistances (not shown) provided therein using a mode resistor set signal MRSB<0:2> and varies the impedance of the selected resistances with the pull-up code signal PCODE<0:N> and the pull-down code signal NCODE<0:N>. As such, the impedance corresponding to the output data DOUT is calibrated so as to be equal to a target impedance.

The structure of the semiconductor memory device according to an embodiment of the present invention that includes the impedance calibration circuit 100 and the data I/O driver 200 will be described in more detail with reference to FIGS. 3 to 5.

Figure 3:
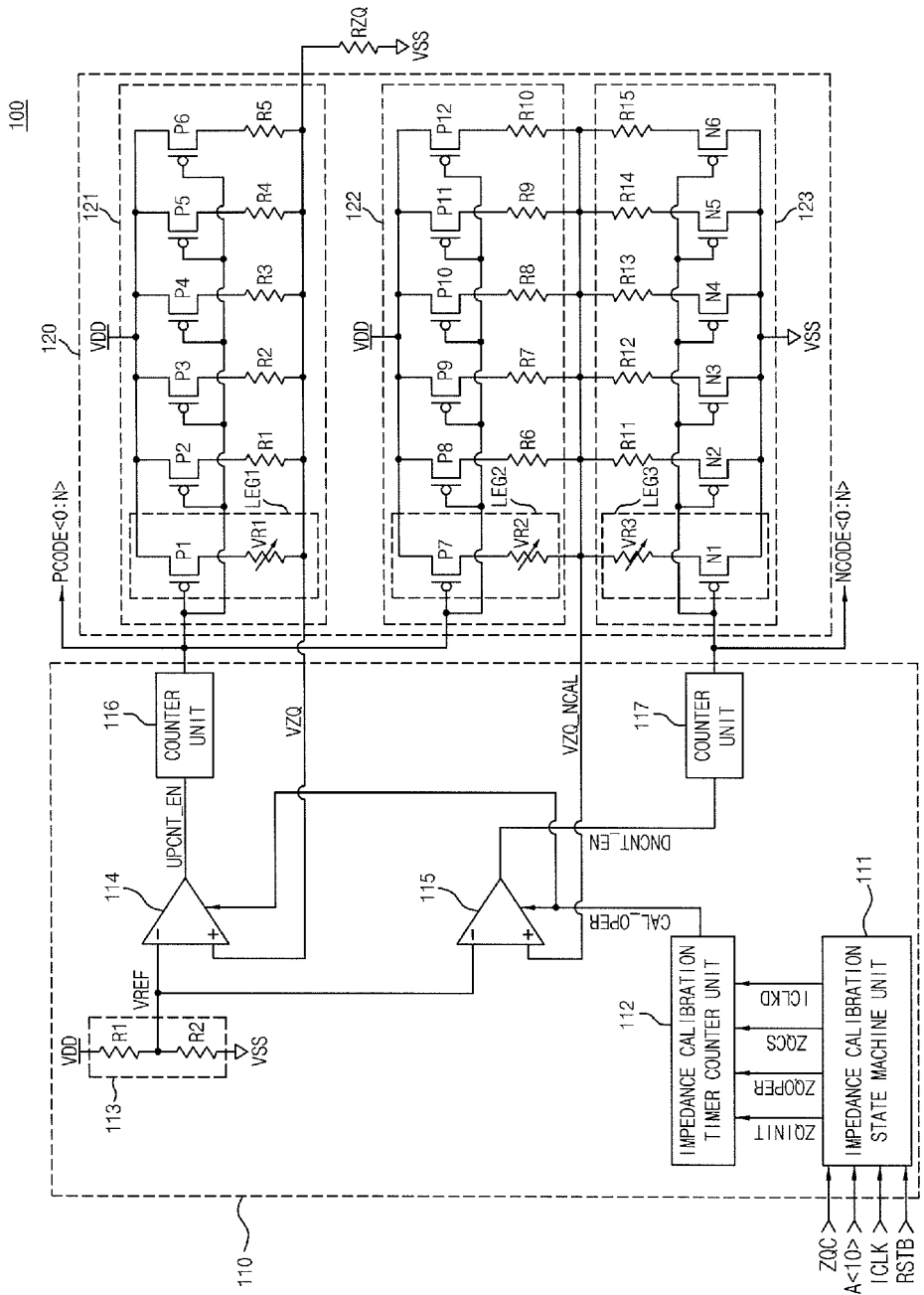
FIG. 3 is a circuit diagram showing the detailed structure of the impedance calibration circuit of FIG. 2.

FIG. 3 is a circuit diagram showing the detailed structure of the impedance calibration circuit 100 of FIG. 2. Referring to FIG. 3, the impedance calibration circuit 100 may include a comparing circuit 110 and a driving circuit 120.

The comparing circuit 110 receives the command signal ZQC, the address signal A<10>, the internal clock ICLK, and the reset signal RSTB in order to determine the impedance calibration time. Further, the comparing circuit 110 compares the level of a reference voltage VREF to the level of a pull-up calibration voltage VZQ during a determined calibration time to output the pull-up code signal PCODE<0:N>, and also compares the level of the reference voltage VREF to the level of a pull-down calibration voltage VZQ_NCAL during the determined calibration time to output the pull-down code signal NCODE<0:N>.

The comparing circuit 110 (which outputs the pull-up code signal PCODE<0:N> and the pull-down code signal NCODE<0:N>) may include an impedance calibration state machine unit 111, an impedance calibration timer counter unit 112, a reference voltage generation unit 113, two comparing units 114, 115 and two counter units 116, 117.

The impedance calibration state machine unit 111 combines the command signal ZQC and the address signal A<10> in order to output calibration command signals ZQINIT, ZQOPER, and ZQCS, and delays the internal clock ICLK to output a delayed internal clock ICLKD. Also, the impedance calibration state machine unit 111 is initialized as it receives the reset signal RSTB.

The operation of the impedance calibration state machine unit 111 is as follows; the time period for performing the impedance calibration is determined by combining the command signal ZQC with the address signal A<10>, and the calibration command signals ZQINIT, ZQOPER, and ZQCS are generated according to the calibration time.

Herein, the calibration command signal ZQINIT is a control signal that indicates performance of a first impedance calibration after power up of the device, and the command signal ZQINIT controls the device so that the impedance calibration is performed for 512 cycles of the internal clock ICLK. Particularly the calibration command signal ZQINIT is generated when the command signal ZQC and the address signal A<10> are both a high level.

The calibration command signal ZQOPER ensures operation of the impedance calibration for 256 cycles of the internal clock ICLK after performing the impedance calibration at once, and the calibration command signal ZQOPER is generated (like the calibration command signal ZQINIT) when the command signal ZQC and the address signal A<10> are both a high level.

The calibration command signal ZQCS controls the device so that the impedance calibration is performed for 64 cycles of the internal clock ICLK, and is generated when the command signal ZQC and the address signal A<10> are both a low level.

The impedance calibration timer counter unit 112 receives the calibration command signals ZQINIT, ZQOPER, and ZQCS and the delayed internal clock ICLKD outputted from the impedance calibration state machine unit 111 in order to output a calibration control signal CAL_OPER that controls the impedance calibration time.

The period of time that the calibration control signal CAL_OPER is enabled is determined by the calibration command signals ZQINIT, ZQOPER and ZQCS, and the impedance calibration operation is performed during the enablement of the calibration control signal CAL_OPER (i.e., the impedance calibration time is the period of time which the calibration control signal CAL_OPER is enabled, and the calibration control signal CAL_OPER is enabled in response to the calibration command signals ZQINIT, ZQOPER, and ZQCS).

The impedance calibration timer counter unit 112 (which outputs the calibration control signal CAL_OPER) includes a counter that counts the impedance calibration time. For example, when the maximum impedance calibration time is 512 cycles, it is desirable that the impedance calibration timer counter unit 112 includes a 9-bit counter that can count the cycles.

The reference voltage generation unit 113 divides a predetermined voltage in order to output the reference voltage VREF. For example, the reference voltage generation unit 113 in the embodiment shown in FIG. 3 includes resistances R1, R2 serially connected between a power voltage VDD terminal and a ground voltage VSS terminal and the reference voltage VREF is generated at the node connecting the resistances R1, R2.

The comparing unit 114 compares the level of the reference voltage VREF to the level of the pull-up calibration voltage VZQ in response to the calibration control signal CAL_OPER and outputs the result of the comparison as a pull-up count enabling signal UPCNT_EN.

The comparing unit 115 compares the level of the reference voltage VREF to the level of the pull-down calibration voltage VZQ_NCAL in response to the calibration control signal CAL_OPER and outputs the result of the comparison as a pull-down count enabling signal DNCNT_EN.

The counter unit 116 performs an up/down count operation in response to the pull-up count enabling signal UPCNT_EN and outputs the result as the pull-up code signal PCODE<0:N>.

The counter unit 117 performs an up/down count operation in response to the pull-down count enabling signal DNCNT_EN and outputs the result as the pull-down code signal NCODE<0:N>.

Meanwhile, the driving circuit 120 compares the impedance of internal resistances VR1~VR3, R1~R5, which is determined using the pull-up code signal PCODE<0:N> and the pull-down code signal NCODE<0:N>, to the impedance of an external resistance RZQ corresponding to the I/O impedance of the external device in order to output the pull-up calibration voltage VZQ and the pull-down calibration voltage VZQ_NCAL. Therefore, the driving circuit 120 can independently vary the internal impedance using the variable resistances VR1~VR3 in order to adjust the level of the pull-up calibration voltage VZQ and the level of the pull-down calibration voltage VZQ_NCAL.

The driving circuit 120 (which outputs the pull-up calibration voltage VZQ and the pull-down calibration voltage VZQ_NCAL) may include a pull-up driving unit 121, a copy pull-up driving unit 122, and a pull-down driving unit 123.

The pull-up driving unit 121 compares an internal impedance determined using the pull-up code signal PCODE<0:N> to the impedance of the external resistance RZQ in order to output the pull-up calibration voltage VZQ.

The pull-up driving unit 121 divides the predetermined voltage and outputs the divided voltage as the pull-up calibration voltage VZQ. In order to accomplish the division, the pull-up driving unit 121 may include a plurality of legs LEG1. Each leg LEG1 includes a corresponding one of a plurality of PMOS transistors P1~P6, and each PMOS transistor P1~P6 provides a power voltage VDD in response to the pull-up code signal PCODE<0:N>. In the pull-up driving unit 121 each of the resistances VR1, R1~R5 is connected between the node to which the power voltage VDD is supplied by the corresponding one of the PMOS transistors P1~P6 and the node from which the pull-up calibration voltage VZQ is outputted. The resistances VR1, R1~R5 (which are connected one to one to the PMOS transistors P1~P6) may be variable resistances or constant resistances. It is particularly desirable that at least one of the resistances VR1, R1~R5 be a variable resistance, and it is also desirable that the constant resistances R1~R5 (the resistances other than the variable resistance VR1) have resistance values that are proportional to one another, and preferably 1:1.

Each of the legs LEG1 (which together have the aforementioned structure) is selectively turned on according to the code value of the pull-up code signal PCODE<0:N>. The sum of the parallel resistance values which are located in the turned on legs form a voltage divider with the resistance value of the external resistance RZQ. That is, the power voltage VDD is divided by the sum of the parallel resistance values of the resistances provided in the turned on legs LEG1 and the resistance value of the external resistance RZQ. The divided voltage is outputted as the pull-up calibration voltage VZQ. When the sum of the parallel resistance values of the resistances provided in the turned on legs LEG1 is equal to the resistance value of the external resistance RZQ, the level of the pull-up calibration voltage VZQ becomes actually equal to the level of the reference voltage VREF.

The copy pull-up driving unit 122 includes a plurality of legs LEG2, and each leg LEG2 may include a corresponding one of a plurality of PMOS transistors P7~P12. Each PMOS transistor P7~P12 provides the power voltage VDD in response to the pull-up code signal PCODE<0:N>. In the copy pull-up driving unit 122 each of the resistances VR2, R6~R10 is connected between the node to which the power voltage VDD is supplied by the corresponding one of the PMOS transistors P7~P12 and a node from which the pull-down calibration voltage VZQ_NCAL is outputted.

The aforementioned copy pull-up driving unit 122 has essentially the same structure as the pull-up driving unit 121, and copies the internal impedance of the pull-up driving unit 121, which is determined by the pull-up code signal PCODE<0:N>. The copied internal impedance is compared to an internal impedance of the pull-down driving unit 123.

The pull-down driving unit 123 compares the internal impedance determined using the pull-down code signal NCODE<0:N> to the internal impedance of the copy pull-up driving unit 122 in order to output the pull-down calibration voltage VZQ_NCAL. The pull-down driving unit 123 has, for example, a structure that divides a predetermined voltage with the internal impedance determined using the pull-down code signal NCODE<0:N> and the internal impedance of the copy pull-up driving unit 122 and outputs the divided voltage as the pull-down calibration voltage VZQ_NCAL.

The pull-down driving unit 123 (which divides the predetermined voltage and outputs it as the pull-down calibration voltage VZQ_NCAL) may include a plurality of legs LEG3. Each of the legs LEG3 includes a corresponding one of a plurality of NMOS transistors N1~N6, with each of the plurality of NMOS transistors N1~N6 providing the ground voltage VSS in response to the pull-down code signal NCODE<0:N>. Each of the resistances VR3, R11~R15 is connected between the node to which the ground voltage VSS is supplied by the corresponding one of the NMOS transistors N1~N6 and the node from which the pull-down calibration voltage VZQ_NCAL is outputted. Herein, the resistances VR3, R11~R15 (which are connected one to one to the NMOS transistors N1~N6) may be variable resistances or constant resistances. It is particularly desirable that at least one of the resistances VR3, R11~R15 be a variable resistance with the remaining constant resistances R11~R15 having resistance values that are proportional to one another, preferably 1:1.

Each of the plurality of the legs LEG3 (which together have the aforementioned structure) is selectively turned on according to the code value of the pull-down code signal NCODE<0:N>. The power voltage VDD is divided by the sum of the parallel resistance values of the resistances provided in the turned on legs LEG3 and the sum of the parallel resistance values of the copy pull-up driving unit 122, and the divided voltage is outputted as the pull-down calibration voltage VZQ_NCAL. When the sum of the parallel resistance values of the resistances provided in the turned on legs LEG3 is equal to the sum of the resistance values of the copy pull-up driving unit 122 (which corresponds to the resistance value of the external resistance RZQ), the level of the pull-down calibration voltage VZQ_NCAL becomes actually equal to the level of the reference voltage VREF.

Meanwhile, the variable resistances VR1~VR3, which are provided in the pull-up driving unit 121, the copy pull-up driving unit 122, and the pull-down driving unit 123 respectively, may have various structures. For example, the variable resistance (e.g. VR1) may include a simple variable resistance device or have a structure in which various resistance elements are combined according to an external control in order to vary the resistance value.

Figure 4A:
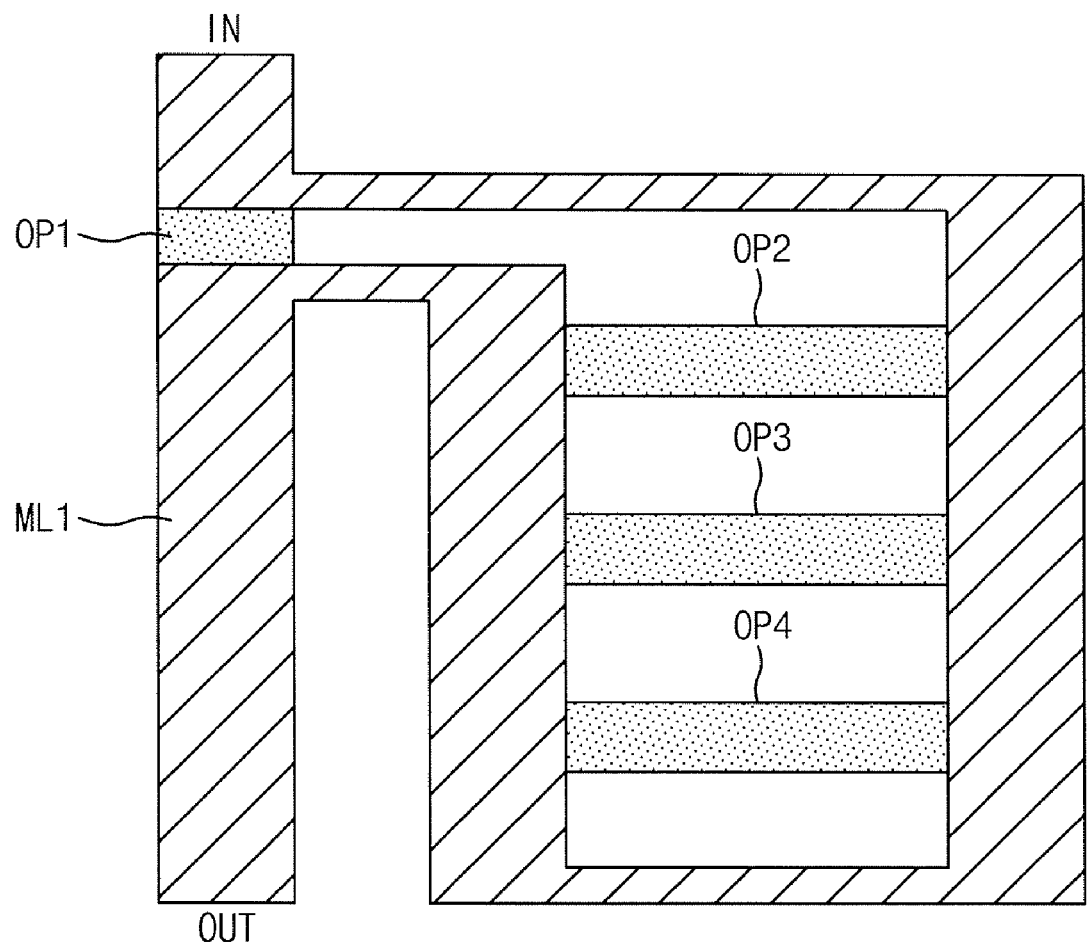
FIG. 4a is a view showing an example of the layout structure of variable resistances VR1~VR3 provided in the impedance calibration circuit of FIG. 3.
Figure 4B:
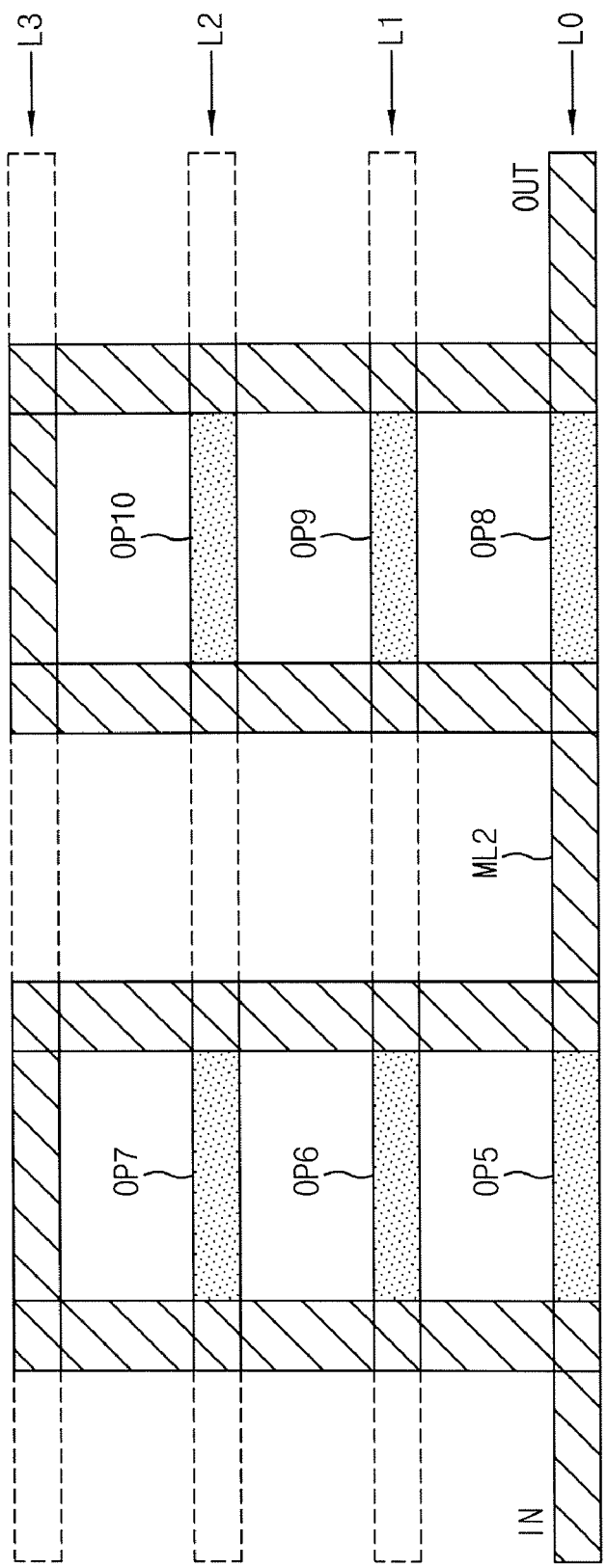
FIG. 4b is a view showing another example of the layout structure of variable resistances VR1~VR3 provided in the impedance calibration circuit of FIG. 3.

In embodiments of the present invention, the variable resistances VR1~VR3 have the layout shown in FIG. 4a or FIG. 4b. The embodiments of the present invention shown in FIGS. 4a and 4b provide simple control and minimum consumption of layout area.

Referring to FIG. 4a, the variable resistance (e.g. VR1) may include a metal line ML1 and at least one metal option OP1~OP4 electrically connected to the metal line ML1.

The metal line ML1 has a passage extending between the end of a driving device (e.g. P1) and the node from which the pull-up calibration voltage VZQ is outputted, and is formed so as to have at least one bended portion. In the embodiment shown in FIG. 4a, the metal line ML1 has a plurality of bended portions. Also, in the variable resistance another component having a resistance element may be substituted for the metal line ML1. Hereinafter, the end of the metal line ML1 electrically connected to the end of the driving device (e.g. P1) is referred to as an input terminal IN and the end of the metal line ML1 electrically connected to the node from which the pull-up calibration voltage VZQ is outputted is referred to as an output terminal OUT.

Each of the respective metal options OP1~OP4 are electrically connected between two predetermined areas of the metal line ML1 (i.e., each metal option forms an electrical connection between one area of the metal line ML1 and another area of the metal line ML1), and the resistance value of the variable resistance VR1 varies according to whether the metal options OP1~OP4 are cut or not. It is desirable that the respective metal options OP1~OP4 or the bended portion of the metal line ML1 itself form at least one closed passage. Another component that has a resistance element and that switches electrical connection between the predetermined areas of the metal line ML1 may be substituted for the metal options OP1~OP4.

In the variable resistance VR1 having the layout shown in FIG. 4a, when, for example, the metal options OP1~OP3 are cut leaving only metal option OP4 intact, a current passage is formed from the input terminal IN to the output terminal via the metal option OP4. In this case, the resistance value is reduced to a level less than the resistance value of a pure metal line ML1 in which all the metal options OP1~OP4 are cut.

Additionally, when the cutting is performed in the following sequences: cutting metal options OP1, OP2, OP4; cutting metal options OP1, OP3, OP4; and cutting metal options OP2~OP4, the resistance value is reduced to a greater extent following the sequences (i.e., the resistance value when OP1, OP3, and OP4 are cut is less than the resistance value when OP1, OP2, and OP4 are cut and the resistance value when OP2~OP4 are cut is less than the resistance value when OP1, OP3, and OP4 are cut).

Another example of the variable resistance (e.g. VR1) may include, as shown in FIG. 4b, a metal line ML2 having a passage extending through two or more layers and at least one bended portion; and metal options OP5~OP10, each of which is formed in a respective layer, and each of which is electrically connected between two areas of the metal line ML2.

Specifically, the metal line ML2 is laid out so that it is bended in a direction from the lowermost layer L0 towards the upper layers L1~L3 and then bended again in the direction of the uppermost layer L3 and then towards the lower layers L0~L2. In this metal line ML2, a material having a resistance element is formed through respective layers and the materials of the layer having a resistance element are electrically connected with each other through a contact.

Each of the metal options OP5~OP10 electrically connects a first area of the metal line ML2 in one of the layers L0~L3 to a second area of the metal line that is opposite to the first area and in the same layer L0~L3. For example, in FIG. 4B metal option OP5 forms an electrical connection between an area of the metal line ML1 in layer L0 to another area of the metal line ML1 in layer L0. Thus, it can be seen that when metal option OP5 is left uncut, the electrical passage of the metal line ML2 becomes shorter.

In the variable resistance having the layout of FIG. 4b, the resistance value is largest when all the metal options OP5~OP10 are cut, and the resistance value is smallest when the metal options OP6, OP7, OP9, and OP10 are cut (thereby leaving metal options OP5, OP8 uncut).

As shown in structures of FIGS. 4a and 4b, the respective variable resistances VR1~VR3 provided in the semiconductor memory device according to an embodiment of the present invention can vary their respective resistance values through selective connection of one or more of a plurality of metal options OP1~OP4 or OP5~OP10 to areas of the respective metal line ML1 or ML2. As such, the resistance value can be varied more easily than varying of the resistance value using a plurality of metal lines and additionally a smaller layout area is consumed.

Figure 5:
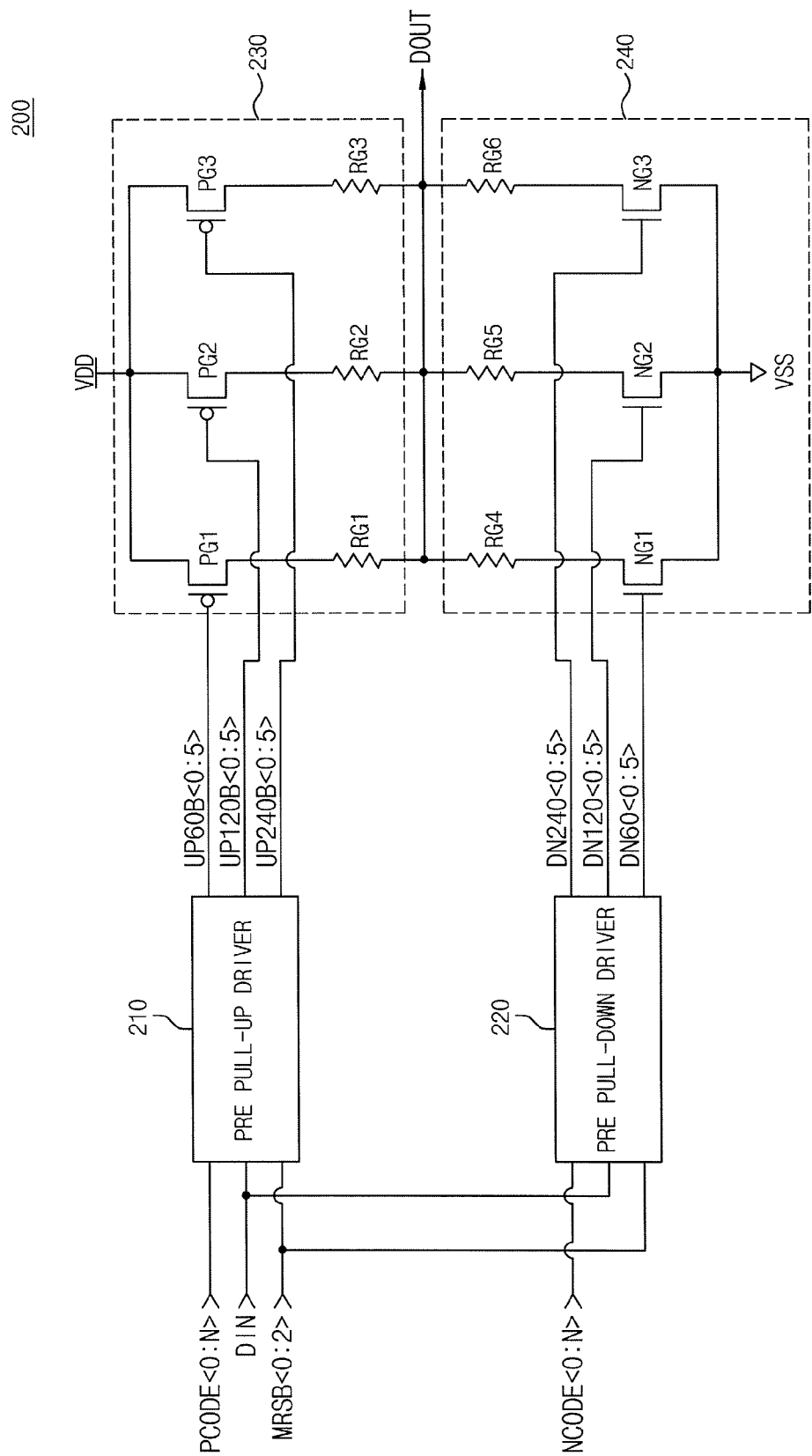
FIG. 5 is a circuit diagram showing the detailed structure of the data I/O driver of FIG. 2.

FIG. 5 is a circuit diagram showing the detailed structure of that data I/O driver of FIG. 2.

Referring to FIG. 5, the data I/O driver 200 according to an embodiment of the present invention includes a pre pull-up driver 210, a pre pull-down driver 220, a main pull-up driver 230, and a main pull-down driver 240.

The pre pull-up driver 210 outputs pull-up control signals UP60B<0:5>, UP120B<0:5>, UP240B<0:5> in response to the pull-up code signal PCODE<0:N>, the input data DIN, and the mode resistor set signal MRSB<0:2>. At this time, enabling of respective pull-up control signals UP60B<0:5>, UP120B<0:5>, UP240B<0:5> is determined by combining the pull-up code signal PCODE<0:N> and the mode resistor set signal MRSB<0:2> in a state in which the input data DIN is inputted.

The pre pull-down driver 220 outputs pull-down control signals DN60B<0:5>, DN120B<0:5>, DN240B<0:5> in response to the pull-down code signal NCODE<0:N>, the input data DIN, and the mode resistor set signal MRSB<0:2>. At this time, enabling of respective pull-down control signals DN60B<0:5>, DN120B<0:5>, DN240B<0:5> is determined by combining the pull-down code signal NCODE<0:N> and the mode resistor set signal MRSB<0:2> in a state in which the input data DIN is inputted.

The main pull-up driver 230 and the main pull-down driver 240 output output data DOUT having a calibrated impedance, in response to the pull-up control signals UP60B<0:5>, UP120B<0:5>, UP240B<0:5> and the pull-down control signals DN60B<0:5>, DN120B<0:5>, DN240B<0:5> respectively.

In other words, the main pull-up driver 230 performs pull-up driving with respect to the output data DOUT and the level of the pull-up driving is adjusted according to the pull-up control signals UP60B<0:5>, UP120B<0:5>, UP240B<0:5>.

Additionally, the main pull-down driver 240 performs pull-down driving with respect to the output data DOUT, and the level of the pull-down driving is adjusted according to the pull-down control signals DN60B<0:5>, DN120B<0:5>, DN240B<0:5>.

In the embodiment of the present invention shown in FIG. 5, the main pull-up driver 230 includes, specifically, a PMOS transistor group PG1 that provides the power voltage VDD in response to the pull-up control signal UP60B<0:5>, a resistance group RG1 connected between the node by which the power voltage VDD is provided by the PMOS transistor group PG1 and the node from which the output data DOUT is outputted, a PMOS transistor group PG2 that provides the power voltage VDD in response to the pull-up control signal UP120B<0:5>, a resistance group RG2 connected between the node by which the power voltage VDD is provided by the PMOS transistor group PG2 and the node from which the output data DOUT is outputted, a PMOS transistor group PG3 that provides the power voltage VDD in response to the pull-up control signal UP240B<0:5>, and the resistance group RG3 connected between the node by which the power voltage VDD is provided by the PMOS transistor group PG3 and the node from which the output data DOUT is outputted.

Herein, each PMOS transistor group (e.g. PG1) includes a plurality of PMOS transistors responding to the code value of respective pull-up control signals, e.g., the PMOS transistor group PG1 includes a plurality of PMOS transistors which respond to the pull-up control signal UP60<0:5>. Since the number of the pull-up control signals in the pull-up control signal UP60<0:5>is 6, the PMOS transistor group PG1 is provided with 6 PMOS transistors corresponding one to one to respective pull-up control signals, e.g. UP60<0:5>. Also, each respective resistance group (e.g. RG1) is provided with 6 resistances corresponding one to one to the 6 PMOS transistors of the corresponding PMOS transistor group (e.g. PG1).

The PMOS transistors provided in the PMOS transistor groups PG1~PG3 are selectively turned on according to the code values of the respective pull-up control signals UP60B<0:5>, UP120B<0:5>, UP240B<0:5>. The level of pull-up driving of the main pull-up driver 230 is adjusted according to the number of turned on PMOS transistors in the respective PMOS transistor groups PG1~PG3 and a parallel resistance value provided in the resistance groups RG1~RG3 is varied.

In the embodiment of the present invention shown in FIG. 5, the main pull-down driver 240 includes, specifically, an NMOS transistor group NG1 that provides the ground voltage VSS in response to the pull-down control signal DN60B<0:5>, a resistance group RG4 connected between the node by which the ground voltage VSS is provided by the NMOS transistor group NG1 and the node from which the output data DOUT is outputted, an NMOS transistor group NG2 that provides the ground voltage VSS in response to the pull-down control signal DN120B<0:5>, a resistance group RG5 connected between the node by which the ground voltage VSS is provided by the NMOS transistor group NG2 and the node from which the output data DOUT is outputted, an NMOS transistor group NG3 that provides the ground voltage VSS in response to the pull-down control signal DN240B<0:5>, and a resistance group RG6 connected between the node by which the ground voltage VSS is provided by the NMOS transistor group NG3 and the node from which the output data DOUT is outputted.

Herein, each NMOS transistor group (e.g. NG1) includes a plurality of NMOS transistors responding to the code value of respective pull-down control signals, e.g. the NMOS transistor group NG1 includes a plurality of NMOS transistors which respond to the pull-up control signal DN60<0:5>. Since the number of the pull-down control signals in the pull-up control signal DN60<0:5> is 6, the NMOS transistor group NG1 is provided with 6 NMOS transistors corresponding one to one to respective pull-down control signals, e.g. DN60<0:5>. Also, each respective resistance group (e.g. RG4) is provided with 6 resistances corresponding one to one to the 6 NMOS transistors of the corresponding NMOS transistor group (e.g. NG1).

The NMOS transistors provided in the NMOS transistor groups NG1~NG3 are selectively turned on according to the code values of the respective pull-down control signals DN60B<0:5>, DN120B<0:5>, DN240B<0:5>. The level of the pull-down driving of the main pull-down driver 240 is adjusted according to the number of turned on NMOS transistors in the respective NMOS transistor groups NG1~NG3 and a parallel resistance value provided in the resistance groups RG4~RG6 is varied.

At least one of the resistance groups RG1~RG3 provided in the main pull-up driver 230 may be provided with at least one variable resistance having the structure shown in either FIG. 4a or FIG. 4b. Also, at least one of the resistance groups RG4~RG6 provided in the main pull-down driver 240 may be provided with at least one variable resistance having the structure shown in either FIG. 4a or FIG. 4b.

As described above, when the variable resistance is included in the main pull-up driver 230 and the main pull-down driver 240, the impedance with respect to the output data DOUT may be varied separately from the control of the impedance calibration circuit 100.

Hereinafter, an impedance calibration operation according to an embodiment of the present invention will be described in detail with reference to FIGS. 2 to 5.

When the command signal ZQC and the address signal A<10> related to the impedance calibration are inputted into the impedance calibration circuit 100, the impedance calibration circuit 100 determines for what cycles the impedance calibration operation will be performed.

Once the cycles for which the impedance calibration operation is performed is determined, the resistance value of the external resistance RZQ and the sum of the resistance values of the pull-up driving unit 121 are compared for the number of cycles previously determined and the result is outputted as the pull-up code signal PCODE<0:N>.

Also, the sum of the resistance values of the copy pull-up driving unit 122, which copies the internal impedance of the pull-up driving unit 121 determined by the pull-up code signal PCODE<0:N>, is compared to the sum of the resistance values of the pull-down driving unit 123 and the result is outputted as the pull-down code signal NCODE<0:N>.

The pull-up code signal PCODE<0:N> is inputted to the pre pull-up driver 210 together with the input data DIN and the mode resistor set signal MRSB<0:2>, and the pre pull-up driver 210 generates the pull-up control signals UP60B<0:5>, UP120B<0:5>, and UP240B<0:5>.

The pull-down code signal NCODE<0:N> is inputted to the pre pull-down driver 220 together with the input data DIN and the mode resistor set signal MRSB<0:2>, and the pre pull-down driver 220 generates the pull-down control signals DN60B<0:5>, DN120B<0:5>, and DN240B<0:5>.

Then, the level of pull-up driving and the sum of the resistance values of the main pull-up driver 230 is adjusted by the pull-up control signals UP60B<0:5>, UP120B<0:5>, and UP240B<0:5>; and the level of pull-down driving and the sum of the resistance values of the main pull-down driver 240 is adjusted by the pull-down control signals DN60B<0:5>, DN120B<0:5>, and DN240B<0:5>. Accordingly, the output data DOUT is outputting in a state in which the impedance is calibrated.

During the impedance calibration operation or in the state that the impedance calibration operation is completed, it is possible to compensate using the variable resistances VR1~VR3 provided in the impedance calibration circuit 100 when an impedance mismatch between the impedance calibration circuit 100 and the data I/O driver 200 is generated.

At this time, as is shown in FIGS. 4*a* and 4*b*, the variable resistances VR1~VR3 easily vary their resistance values by selective cutting of the metal options OP1~OP4 or OP5~OP10. Additionally, it is possible to minimize the layout area by using the metal line ML1 having a bended portion or the metal line formed across more than two layers L0~L3.

Further, the variable resistance having this structure may also be provided in the data I/O driver 200. In this case, it is possible to easily vary the impedance with respect to the output data DOUT by varying the sum of the resistance values of the data I/O driver 200 rather than by the impedance calibration circuit 100.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An impedance calibration circuit, comprising:
    a driving circuit comprising a plurality of legs in parallel, each leg including a switching element and a resistance element in series, a resistance element of at least one of the legs being a variable resistance, wherein an impedance of the legs is varied according to a code signal controlling the switching elements of the legs in order to calibrate the impedance, wherein the driving circuit compares an impedance of the legs to an input/output impedance of an external device and provides the result of the comparison as a calibration voltage, and wherein the variable resistance of the resistance element of at least one of the legs can be controllable adjusted independent of the code signal to vary the impedance of the legs; and
    a comparing circuit comparing the calibration voltage to a reference voltage in order to provide the code signal for calibrating an impedance corresponding to output data with the input/output impedance of the external device, wherein the variable resistance has a resistance value that is varied independently of the impedance determined following the code value of the code signal.

2. The impedance calibration circuit as set forth in claim 1, wherein the legs are connected in parallel and the plurality of parallel connected legs are connected to an external resistance corresponding to the input/output impedance of an external device, and legs except for the at least one leg having a variable resistance have resistance values that have a predetermined proportional relationship with one another.

3. The impedance calibration circuit as set forth in claim 2, wherein the legs except for the at least one leg having a variable resistance have resistance values that have a 1:1 relationship with one another.

4. A semiconductor memory device, comprising:
    an impedance calibration circuit comprising a plurality of legs in parallel, each leg including a switching element and a resistance element in series, a resistance element of at least one of the legs being a variable resistance, wherein an impedance of the legs is varied according to a code signal controlling the switching elements of the legs in order to calibrate the impedance and the variable resistance of the resistance element of at least one of the legs can be controllable adjusted independent of the code signal, and wherein the impedance calibration circuit compares an impedance of the legs to an input/output impedance of an external device in order to provide the code signal; and
    a data input/output driver driving data and calibrating an impedance corresponding to the data in response to the code signal provided by the impedance calibration circuit such that the impedance corresponding to the data is calibrated with the input/output impedance of the external device, wherein the variable resistance has a resistance value that is varied independently of the impedance determined following the code value of the code signal.

5. The semiconductor memory device as set forth in claim 4, wherein the impedance calibration circuit adjusts a code value of the code signal according to the comparison of the impedance of the legs to the input/output impedance of the external device, and the impedance of the legs is adjusted in response to the code value of the code signal.

6. The semiconductor memory device as set forth in claim 5, wherein the impedance calibration circuit comprises:
    a driving circuit comprising the legs in parallel, each leg including the switching element and the resistance element in series, the resistance element of at least one of the legs including the variable resistance, wherein the driving circuit compares the impedance of the legs to the input/output impedance of the external device and provides the result as a calibration voltage; and
    a comparing circuit comparing the calibration voltage and a reference voltage and providing the code signal.

7. The semiconductor memory device as set forth in claim 6, wherein the driving circuit comprises:
    a plurality of driving devices each providing a predetermined voltage in response to the code signal;
    wherein each of the at least one variable resistance corresponds to one of the plurality of driving devices and each of the at least one variable resistance is connected between a node which receives the predetermined voltage provided by the corresponding driving device and a node to which the calibration voltage is provided, and
    wherein the remaining legs are constant resistances and each constant resistance corresponds to one of the plurality of driving devices, wherein each of the constant resistances is connected between a node which receives the predetermined voltage provided by the corresponding driving device and the node to which the calibration voltage is provided.

8. The semiconductor memory device as set forth in claim 7, wherein the constant resistances have resistance values that have a predetermined proportional relationship with one another.

9. The semiconductor memory device as set forth in claim 8, wherein the constant resistances have resistance values that have a proportional 1:1 relationship with one another.

10. The semiconductor memory device as set forth in claim 4, wherein the data input/output driver comprises a plurality of resistances that vary the impedance corresponding to the data in response to the code signal, and the resistances include constant resistances or constant resistances and at least one variable resistance.

* * * * *